(12) United States Patent
Schlarb

(10) Patent No.: US 11,408,917 B2
(45) Date of Patent: Aug. 9, 2022

(54) REDUNDANT CURRENT-MEASURING ARRANGEMENT WITH DETECTION OF INTERRUPTIONS OF AN ELECTRIC CIRCUIT

(71) Applicant: Siemens Aktiengesellschaft, Munich (DE)

(72) Inventor: Eberhard Schlarb, Gundelfingen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/052,502

(22) PCT Filed: Apr. 29, 2019

(86) PCT No.: PCT/EP2019/060878
§ 371 (c)(1),
(2) Date: Nov. 2, 2020

(87) PCT Pub. No.: WO2019/211221
PCT Pub. Date: Nov. 7, 2019

(65) Prior Publication Data
US 2021/0173017 A1      Jun. 10, 2021

(30) Foreign Application Priority Data

May 3, 2018   (DE) .......................... 102018206804.6

(51) Int. Cl.
*G01R 15/14*       (2006.01)
*G01R 31/50*       (2020.01)
(Continued)

(52) U.S. Cl.
CPC ......... *G01R 15/146* (2013.01); *G01R 15/144* (2013.01); *G01R 31/50* (2020.01); *G01R 31/52* (2020.01); *G01R 31/54* (2020.01)

(58) Field of Classification Search
CPC .... G01R 15/146; G01R 15/144; G01R 31/00; G01R 31/52; G01R 31/54; G01R 19/12
See application file for complete search history.

(56) References Cited

U.S. PATENT DOCUMENTS 11,079,409 B2 *   8/2021   Maier .................... G01R 1/203
2008/0258711 A1 * 10/2008  Niroomand .......... G01R 15/146
                                                     324/140 R
(Continued)

FOREIGN PATENT DOCUMENTS

DE     102011080603      2/2013
DE     102012205401     10/2013
(Continued)

OTHER PUBLICATIONS

PCT International Search Report dated Aug. 26, 2019 based on PCT/EP2019/060878 filed Apr. 29, 2019.

*Primary Examiner* — Christopher E Mahoney
(74) *Attorney, Agent, or Firm* — Cozen O'Connor

(57) ABSTRACT

A measuring arrangement for redundantly determining a quantitative value of a current flow includes a first and second current-measuring modules connected in parallel, where the first current-measuring module includes a first analogue input and a first current measurement resistor and a voltage-measuring unit to determine the value of current flowing into the analogue input and through the first current measurement resistor, the second current measuring module includes a second analogue input and a second current measurement resistor and a voltage-measuring unit to determine the value of current flowing into the second analogue input and through the second current measurement resistor, and includes a control unit that detects a gradual change in voltages determined by the voltage-measuring units, and when gradual changes in the voltages that are counter to (Continued)

each other occur, a current-measuring module is excluded from the determination of the quantitative value of the current flow.

7 Claims, 2 Drawing Sheets

(51) Int. Cl.
 *G01R 31/52* (2020.01)
 *G01R 31/54* (2020.01)

(56) References Cited

U.S. PATENT DOCUMENTS

| | | |
|---|---|---|
| 2012/0074785 A1 | 3/2012 | Fichtlscherer et al. |
| 2013/0257444 A1 | 10/2013 | Boehm et al. |
| 2014/0253102 A1* | 9/2014 | Wood ............... G01R 23/02 324/140 R |
| 2015/0219696 A1 | 8/2015 | Eckrich et al. |
| 2016/0371212 A1* | 12/2016 | Griesbaum ........ G05B 19/0423 |
| 2017/0168131 A1 | 6/2017 | Schneider et al. |
| 2017/0219642 A1 | 8/2017 | Maier et al. |

FOREIGN PATENT DOCUMENTS

| | | |
|---|---|---|
| DE | 102014208680 | 11/2015 |
| EP | 2434358 | 7/2017 |
| EP | 3200033 | 8/2017 |
| WO | 2014037465 | 3/2014 |
| WO | 2017167732 | 10/2017 |

\* cited by examiner

REDUNDANT CURRENT-MEASURING ARRANGEMENT WITH DETECTION OF INTERRUPTIONS OF AN ELECTRIC CIRCUIT

CROSS-REFERENCE TO RELATED APPLICATIONS

This is a U.S. national stage of application No. PCT/EP2019/060878 filed 29 Apr. May 2019. Priority is claimed on German Application No. 10 2018 206 804.6 filed 3 May 2018, the content of which is incorporated herein by reference in its entirety.

BACKGROUND OF THE INVENTION

1. Field of the Invention

The invention relates to a measuring arrangement for the redundant determination of a current value, to methods for detecting an interruption of an electric circuit in the measuring arrangement configured for the redundant determination of the current value, and to a control unit for the measuring arrangement.

2. Description of the Related Art

Similar input modules in automation systems regularly detect process values via signals, which have a current value in a range of 0 to 20 mA or of 4 to 20 mA. In order to increase availability, a corresponding measuring transducer of the input modules is connected, for instance, in parallel with two corresponding input channels on two redundantly operating input modules. The problem here however is that the current to be measured is distributed over the two input channels, and its interpretation must occurs as a function of the state of the other input channel. A one-sided wire break must be detected as quickly as possible, for instance, and must be taken into account with the conversion of the measuring result to avoid misinterpretations.

To increase the availability of the detection of the process values, the following options are known to date:
1) the already mentioned parallel circuit of two active input channels: One disadvantage of this method is that the current value doubles at the input channel that remains in the case of a one-sided wire break. This measuring error can only be corrected in a calculative manner by detecting the wire break and in this time possibly already triggers an unwanted switching operation.
2) series connection of the analogue inputs: The complete current therefore flows over both input channels. The disadvantage here, however, is that this method is only possible with potential-separated input channels and renders necessary external circuits (for instance, a bridging of each input channel with diodes in order not to interrupt the electric circuit in the case of a wire break).
3) parallel connection of an active (low impedance) and a passive (high impedance) input channel: One disadvantage here is that only the active input channel can detect a wire break. Whether the passive input channel is available is only apparent if on account of an error on the active input channel a switch is made to the passive input channel.

DE 10 2012 205 401 A1 discloses a sensor system for the redundant determination of a battery current flowing over the poles of a battery.

EP 2 434 358 B1 discloses a system for the redundant supply of a load with a voltage.

WO 2017/167732 A1 discloses an arrangement with at least two redundant parallel-connected analogue input units for a measuring current. A current-measuring resistor (also referred to as a shunt) is connected with high impedance on a passive side of the arrangement, such that as a result of the parallel coupling of the two analogue input units, the voltage on an input circuit of the active side is also measured roughly. On account of the voltage drop in the input circuit of the active input, during normal operation the measured voltage on the high impedance (passive) side is always greater by a small factor than on the low impedance (active) side of the arrangement. An interruption in the current-measuring circuit ("wire break") on the passive side can be detected by infringing this criterion. Detecting an interruption in the current-measuring circuit on the active side is not possible with the arrangement disclosed in WO 2017/167732 A1 with 0 to 20 mA measurements and not always possible in a timely manner with 4 mA to 20 mA measurements. Moreover, the interruption can also only be detected on the passive side once one or more faulty current-measuring values have been detected.

SUMMARY OF THE INVENTION

In view of the foregoing, it is an object of the present invention to provide an efficient method for detecting a one-sided interruption in a current-measuring circuit in redundantly configured analogue input channels of an automation system, which in particular enables a quicker switchover to an undisturbed analogue input channel.

This and other objects and advantages are achieved in accordance with the invention by a measuring arrangement for the redundant determination of a current value with at least one first current-measuring module and at least one second current-measuring module, by methods of detecting an interruption in an electric circuit in a measuring arrangement configured for the redundant determination of a current value and by a control unit for a measuring arrangement, where the inventive measuring arrangement for the redundant determination of a quantitative value of a current flow comprises at least one first current-measuring module and at least one second current-measuring module connected in parallel with the first current-measuring module. The first current-measuring module comprises at least one first analogue input and at least one first current-measuring resistor and a voltage-measuring unit associated therewith in order to determine a current value of a current flowing into the analogue input and through the first current-measuring resistor. The second current-measuring module comprises at least one second analogue input and at least one second current-measuring resistor and an associated voltage-measuring unit in order to determine a current value of a current flowing into the second analogue input and through the second current-measuring resistor.

The measuring arrangement also comprises a control unit, which is configured to detect a gradual course of the voltages determined by the voltage-measuring units and in the presence of a reverse flow of the gradual courses of the voltages, to exclude a current-measuring model from a determination of the quantitative value of the current flow. Here, the current flow can originate from a sensor supply that is internal to the current-measuring module or any external current source. In particular, the current flow originates from a measuring transducer, which provides, for instance, an output current in a range of 0 to 20 milliamperes.

The current-measuring modules are configured to determine, in a manner known per se via a reference resistor (shunt resistor) and a voltage-measuring unit, a quantitative value of a current flow, which is controlled from a measuring transducer and flows through the reference resistor or through the respective current-measuring module. Here, the measuring transformer can be fed by one, or to increase availability, several parallel-connected sensor supplies, or by one external source. The current-measuring modules are connected here in parallel in order, in the event of failure of one of the two modules, to enable the current measurement to continue.

The control unit can be any type of unit, which is configured to receive and evaluate signals from the voltage-measuring units. In particular, the control unit for this means can comprise a microprocessor and memory.

If an interruption in an electric circuit occurs in the first current-measuring model, for instance, the voltage determined by the first current-measuring module thus reduces because current can no longer flow through the first current-measuring resistor. On the other hand, the voltage determined by the second current-measuring module increases, because the complete current now flows over the second current-measuring module. As a result of the control unit being configured in accordance with the invention to detect this reverse flow of the gradual courses of the determined voltages, the measuring arrangement can respond rapidly and reliably to the interruption, by the current-measuring module affected by the interruption in the circuit being excluded from the determination of the value for the current flow.

In an advantageous embodiment of the invention, the control unit is configured to change a resistance value of the current-measuring resistor of the at least one current-measuring module, which current-measuring module was previously not excluded from the determination of the quantitative value of the current flow (flowing from a sensor supply, for instance). If the current-measuring resistor of the current-measuring module unaffected by the electric circuit interruption was in a high impedance state before detecting the counter-rotating voltage gradients, for instance, then the control unit or elements connected thereto triggers the current-measuring resistor of the unaffected current-measuring module to change into a low impedance state, in order to actively determine the sum of the current flow.

Here, the control unit can be arranged spatially and functionally independently of the voltage-measuring units, where in this regard the control unit must have corresponding connections in order to access the voltage-measuring units for signaling purposes.

The control unit is particularly preferably assigned spatially and/or functionally to one of the voltage-measuring units. This means that the control unit has direct access to the values determined by the voltage-measuring unit and in particular no or only negligible delays occur between determining the faulty voltage-measuring values and taking corresponding action. The control unit arranged in one of the two voltage-measuring units is connected here to the other voltage-measuring unit of the other current-measuring module, in order to enable a comparison of the gradual course of the determined voltage values.

It is alternatively also possible to provide two or more control units, which are each assigned spatially and/or functionally to one of the voltage-measuring units, and which provide the previously described functionality via an alternating data exchange.

With an advantageous embodiment of the invention, at least two of the voltage-measuring units are configured to determine voltages via an integrating measuring method. With one such integrating measuring method, a voltage measured value is determined from a number of partial measurements in one measuring interval. It is possible to very quickly determine, from these partial measurements (for instance, within ten percent of a duration of a measuring interval, i.e., significantly earlier than the final voltage measured value itself), whether the determined voltage values in both current-measuring modules move in opposite directions in the case of an interruption of an electric circuit.

In other words, it is possible to rapidly detected whether the gradual courses of the determined voltage values move in the opposite direction before a faulty measured value is actually output by the voltage-measuring units. As a result, a resistance value of at least one of the current-measuring resistors can be changed more quickly than was the case with previously known measuring arrangements.

The object in accordance with the invention is further achieved by a method for detecting an interruption of an electric circuit in a measuring arrangement embodied for the redundant determination of a quantitative value of a current flow (flowing from a sensor transducer, for instance), where the measuring arrangement comprises at least one first current-measuring module and at least one second current-measuring module connected in parallel with the first current-measuring module.

The first current-measuring module comprises at least one first analogue input and at least one first current-measuring resistor and an associated voltage-measuring unit in order to determine a current value of a current flowing into the analogue input and through the first current-measuring resistor.

The second current-measuring module comprises at least one second analogue input and at least one second current-measuring resistor and an associated voltage-measuring unit in order to determine a current value of a current flowing into the second analogue input and through the second current-measuring resistor.

In accordance with the method of the invention, a gradual course of the voltages determined by the voltage-measuring units is detected via a control unit, and in the presence of a reverse flow of the gradual courses of the voltages, a current-measuring module is excluded from a determination of the quantitative value of the current flow.

The control unit is preferably assigned spatially and/or functionally to one of the voltage-measuring units, to which reference was previously already made.

The object in accordance with the invention is likewise achieved by a control unit for an inventive measuring arrangement for implementing the disclosed embodiments of method in accordance with the invention.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The above-described properties, features and advantages of this invention and the manner in which these are achieved will now become clearer and more intelligible in conjunction with the following description of the exemplary embodiment, which will be explained in detail making reference to the drawings, in which.

DETAILED DESCRIPTION THE EXEMPLARY EMBODIMENTS

Figure 1:
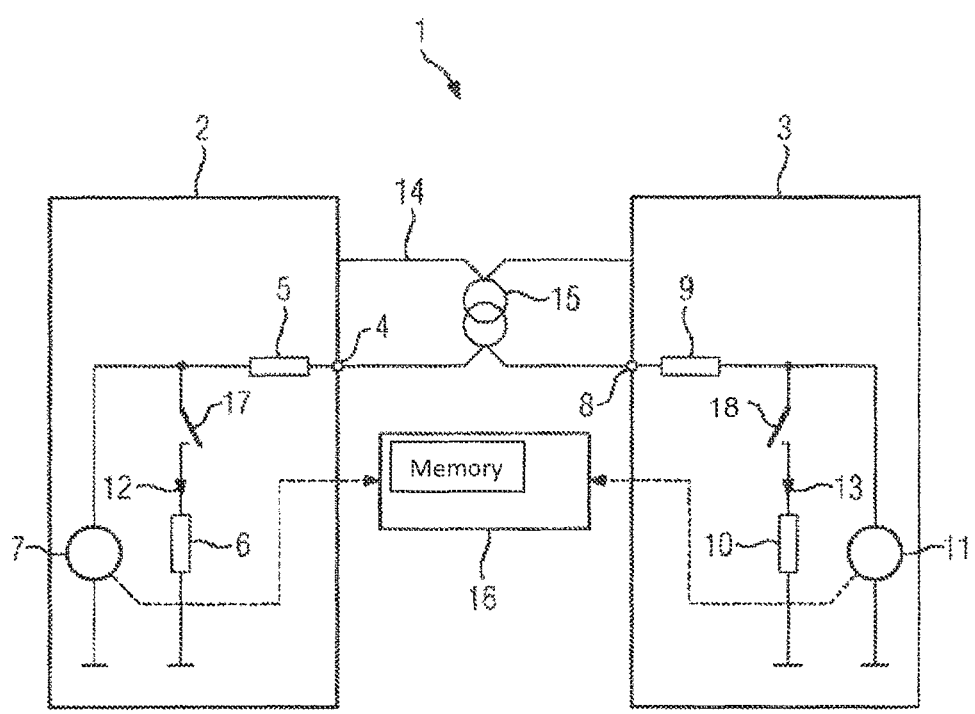
FIG. 1 shows a circuit diagram of a measuring arrangement in accordance with the invention.

FIG. 1 shows a circuit diagram of an inventive measuring arrangement 1. The measuring arrangement 1 comprises a first current-measuring module 2 and a second current-measuring module 3. The first current-measuring module 2 comprises a first analogue input 4 with an input resistor 5, a first current-measuring resistor 6 and a voltage-measuring unit 7 (also referred to in the Figure with U1). The second current-measuring module 3 comprises a second analogue input 8 with an input resistor 9, a second current-measuring resistor 10 and a voltage-measuring unit 11 (also referred to in the FIG. 1 with U2).

Each of the two current-measuring modules 2, 3 is configured to determine a current value 12, 13 by the respective current-measuring resistors 6, 10 via the current-measuring resistor 6, 10 and the voltage-measuring unit 7, 11 associated therewith. The measuring arrangement 1 serves for the redundant determination of a quantitative value of a current flow 15 flowing from a sensor supply 14.

The first current-measuring module 2 is configured to be high impedance or passive in terms of its basic state. This means that the first current-measuring resistor 6 has a relatively low resistance value compared with the second current-measuring resistor. By way of example, the high impedance first current-measuring resistor 6 can have a resistance value that is higher by a factor 1000 than the low impedance second current resistor 10. On account of the high first current-measuring resistor 6, the current value 12, which flows through the first current-measuring resistor 6 or through the first current-measuring module 2, is smaller by orders of magnitude than the current value 13, which flows through the second current measuring resistor 10 or through the second current-measuring module 3.

Both current-measuring modules 2, 3 are connected in parallel. The input resistor 5 of the first current-measuring module 2 has a low resistance value, as a result of which in combination with the low current value 12, which flows through the first current module 2, only a negligible voltage drops across the input resistor 5. Contrary to this, the voltage across the input resistor 9 of the second current-measuring module 3 is not negligible on account of the clearly higher current value 13 that flows through the second current-measuring module 3. The voltage that the voltage-measuring unit 11 measures across the second current-measuring resistor 10 of the second current-measuring module 3 is therefore always larger by a calculatable sum than the voltage which the voltage-measuring unit 7 measures across the first current-measuring resistor 6 of the first current-measuring module 2.

The measuring arrangement 1 moreover has a control unit 16, which, in each case, has a connection to the voltage measuring unit 7 of the first current-measuring module 2 and to the voltage-measuring unit 11 of the second current-measuring module 3. A wire break 17, i.e., an interruption in the electric circuit on the passive side (first current-measuring module 2) can be detected easily and rapidly via the inventive measuring arrangement 1 by infringing this criterion. The control unit 16 excludes the first current-measuring module 2 accordingly from a determination of the quantitative value of the current flow 15 flowing from the sensor supply 14.

If a one-sided wire break 18 occurs on the active side (second current measuring module 3), the voltage determined across the second current-measuring resistor 10 drops rapidly. At the same time, the voltage determined by way of the first current-measuring resistor 6 increases rapidly on the passive side (first current-measuring module 2) on account of the high impedance current-measuring resistor 6. The simultaneous occurrence of these counter-rotating gradients is detected by the control unit 16. To this end, the control unit directly evaluates individual integration stages (partial measured values) of the voltage-measuring units 7, 11 moving on the basis of an integrating measuring method.

Detection of the counter-rotating gradients of the determined voltage values results directly in an interruption in an ongoing measuring interval. At the same time, the resistance value of the high impedance first current-measuring resistor 6 is significantly reduced, such that the first current-measuring module 2 functions as an active side. The control unit 16 moreover excludes the second current-measuring module 3 accordingly from a determination of the quantitative value of the current flow 15 flowing from the sensor supply 14.

During this process, the current measured value is frozen until a new measuring interval is terminated on the basis of the new current-measuring resistors 6, 10. The reproduction of a distorted measured value on a superordinate automation can be avoided, for instance.

With the disclosed embodiments of the inventive measuring arrangement 1, a maximum temporal distortion of the measured value is significantly reduced in terms of time and content until the wire break is detected or a current-measuring circuit of a current-measuring module is interrupted.

Figure 2:
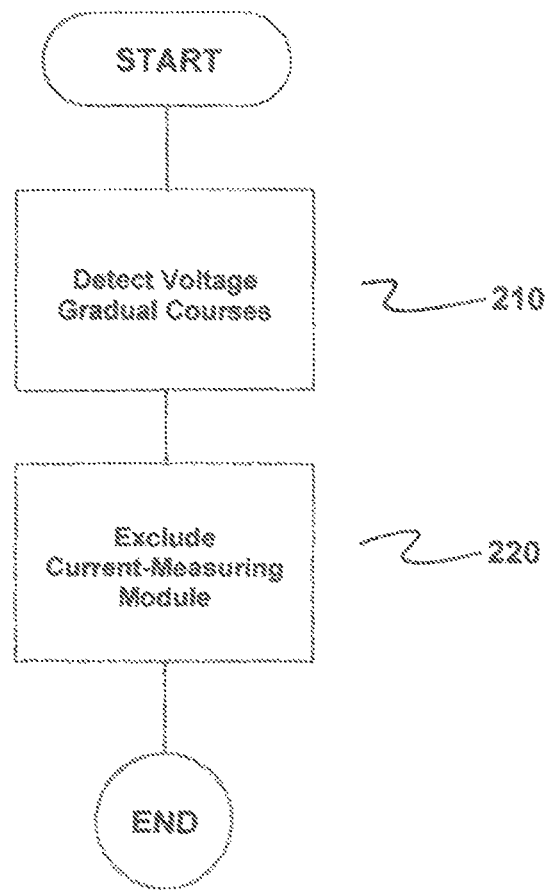
FIG. 2 is a flowchart of the method in accordance with the invention.

FIG. 2 is a flowchart of a method for detecting an interruption in an electric circuit in a measuring arrangement 1 configured for redundant determination of a quantitative value of a current flow 15, wherein the measuring arrangement 1 includes at least one first current-measuring module 2 and at least one second current-measuring module 3 connected in parallel with the first current-measuring module 2, where the at least one first current-measuring module 2 comprises at least one first analogue input 4 and at least one first current-measuring resistor 6 and an associated voltage-measuring unit 7 in order to determine a current value 12 of a current flowing into the at least one analogue input 4 and through the at least one first current-measuring resistor 6, and where the at least one second current measuring module 3 comprises at least one second analogue input 8 and at least one second current measuring resistor 10 and an associated voltage measuring unit 11 in order to determine a current value 13 of a current flowing into the at least one second analogue input 8 and through the at least one second current measuring resistor 10.

The method comprises detecting gradual courses of the voltages determined by the associated voltage-measuring units 7, 11 via a control unit 16, as indicated in step 210.

Next, a current-measuring module 2, 3 is exclude from the determination of the quantitative value of the current flow 15 in the presence of a reverse flow of the gradual courses of the voltages, as indicated in step 220.

Although the invention has been illustrated and described in greater detail with the preferred exemplary embodiment, the invention is not restricted by the examples disclosed and other variations can be derived therefrom by the person skilled in the art without departing from the protective scope of the invention.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A measuring arrangement for redundant determination of a quantitative value of a current flow, the measuring arrangement comprising:
    at least one first current-measuring module comprising at least one first analogue input and at least one first current-measuring resistor and an associated voltage-measuring unit to determine a current value of a current flowing into the at least one first analogue input and through the at least one first current-measuring resistor; and
    at least one second current-measuring module connected in parallel with the at least one first current-measuring module, the at least one second current-measuring module comprising at least one second analogue input and at least one second current-measuring resistor and an associated voltage-measuring unit to determine a current value of a current flowing into the at least one second analogue input and through the at least one second current-measuring resistor; and
    a control unit which is configured to detect gradual courses of voltages determined by the associated voltage-measuring units and configured to exclude a current-measuring module from a determination of the quantitative value of the current flow in a presence of a reverse flow of the gradual courses of the voltages comprising current flowing no longer flowing through the first current-measuring resistor of one of the first or second at least one first current-measuring modules and voltage determined by the second current-measuring module increasing based on an entirety of the current flowing through the second current-measuring module of another of the first or second at least one first current-measuring modules.

2. The measuring arrangement as claimed in claim 1, wherein the control unit is further configured to change a resistance value of the at least one current-measuring resistor of the at least one current-measuring module, said at least one current-measuring module being previously not excluded from the determination of the quantitative value of the current flow.

3. The measuring arrangement as claimed in claim 1, wherein the control unit is assigned at least one of (i) spatially and (ii) functionally to one of the voltage-measuring units.

4. The measuring arrangement as claimed in claim 1, wherein at least one of the voltage-measuring units is configured to determine voltages via an integrating measuring method.

5. A method for detecting an interruption in an electric circuit in a measuring arrangement configured for redundant determination of a quantitative value of a current flow, the measuring arrangement including at least one first current-measuring module and at least one second current-measuring module connected in parallel with the first current-measuring module, the at least one first current-measuring module comprising at least one first analogue input and at least one first current-measuring resistor and an associated voltage-measuring unit to determine a current value of a current flowing into the at least one analogue input and through the at least one first current-measuring resistor, and the at least one second current-measuring module comprising at least one second analogue input and at least one second current-measuring resistor and an associated voltage-measuring unit to determine a current value of a current flowing into the at least one second analogue input and through the at least one second current measuring resistor, the method comprising:
    detecting gradual courses of the voltages determined by the associated voltage-measuring units via a control unit; and
    excluding a current-measuring module from a determination of the quantitative value of the current flow in a presence of a reverse flow of the gradual courses of the voltages comprising current flowing no longer flowing through the first current-measuring resistor of one of the first or second at least one first current-measuring modules and voltage determined by the second current-measuring module increasing based on an entirety of the current flowing through the second current-measuring module of another of the first or second at least one first current-measuring modules.

6. The method as claimed in claim 5, wherein at least one of the voltage-measuring units determines voltages via an integrating measuring method.

7. A control unit for a measuring arrangement, comprising:
    a processor; and
    memory;
    wherein the control unit is configured to:
        detect gradual courses of voltages determined by associated voltage-measuring units via a control unit; and
        exclude a current-measuring module from a determination of a quantitative value of a current flow in a presence of a reverse flow of the gradual courses of the voltages comprising current flowing no longer flowing through a first current-measuring resistor of one of a first or second at least one first current-measuring modules and voltage determined by a second current-measuring module increasing based on an entirety of the current flowing through the second current-measuring module of another of the first or second at least one first current-measuring modules.

* * * * *